(12) United States Patent
Fujii

(10) Patent No.: US 9,093,485 B2
(45) Date of Patent: Jul. 28, 2015

(54) TRANSPORT METHOD

(75) Inventor: Yoshinori Fujii, Shizuoka (JP)

(73) Assignee: ULVAC, INC., Kanagawa (JP)

( * ) Notice: Subject to any disclaimer, the term of this patent is extended or adjusted under 35 U.S.C. 154(b) by 530 days.

(21) Appl. No.: 13/635,173

(22) PCT Filed: Apr. 14, 2011

(86) PCT No.: PCT/JP2011/002207
§ 371 (c)(1),
(2), (4) Date: Sep. 14, 2012

(87) PCT Pub. No.: WO2011/148560
PCT Pub. Date: Dec. 1, 2011

(65) Prior Publication Data
US 2013/0004284 A1    Jan. 3, 2013

(30) Foreign Application Priority Data

May 26, 2010    (JP) ................. 2010-120035

(51) Int. Cl.
*B65G 49/07* (2006.01)
*H01L 21/687* (2006.01)
*H01L 21/677* (2006.01)

(52) U.S. Cl.
CPC .... *H01L 21/67742* (2013.01); *H01L 21/67745* (2013.01); *H01L 21/68707* (2013.01)

(58) Field of Classification Search
CPC ............... H01L 21/67742; H01L 21/67745; H01L 21/67793; H01L 21/68707; H01L 21/68728
USPC .......... 414/744.8, 749.6, 751.1, 806; 294/103.1, 197, 213
See application file for complete search history.

(56) References Cited

U.S. PATENT DOCUMENTS

| 6,305,898 | B1 * | 10/2001 | Yamagishi et al. | ........ 414/744.5 |
| 7,661,921 | B2 * | 2/2010 | Kim et al. | ........ 414/744.5 |
| 7,987,019 | B2 * | 7/2011 | Morikawa | ........ 700/218 |
| 7,988,216 | B2 * | 8/2011 | Ku et al. | ........ 294/103.1 |

(Continued)

FOREIGN PATENT DOCUMENTS

| JP | 2002-134586 A | 5/2002 |
| JP | 2002-141405 A | 5/2002 |

(Continued)

OTHER PUBLICATIONS

International Search Report for PCT Patent App. No. PCT/JP2011/002207 (May 17, 2011).

*Primary Examiner* — Dean Kramer
(74) *Attorney, Agent, or Firm* — Cermak Nakajima & McGowan LLP; Tomoko Nakajima

(57) ABSTRACT

By a transport robot having a hand provided with stationary clamp members and a movable clamp member which pinches a to-be-transported object S between the movable clamp member and the stationary clamp members, after transporting the to-be-transported object-S in a horizontal posture to a transport destination, the hand is lowered in a state in which the movable clamp member is receded to an unclamped position, thereby transferring the to-be-transported object onto a plurality of supporting pins which are disposed at the transport destination. In the method mentioned above, an arrangement is made that, even if the stationary clamp members give rise to dents due to wear, the to-be-transported object is arranged to be transferred onto the supporting pins without problems.

4 Claims, 2 Drawing Sheets

(56) References Cited

U.S. PATENT DOCUMENTS

| | | | |
|---|---|---|---|
| 8,720,965 B2 * | 5/2014 | Hino et al. | 294/213 |
| 2002/0071756 A1 * | 6/2002 | Gonzalez | 414/941 |
| 2006/0192400 A1 * | 8/2006 | Kim et al. | 294/103.1 |
| 2007/0081886 A1 * | 4/2007 | Myoung et al. | 414/806 |

FOREIGN PATENT DOCUMENTS

| | | |
|---|---|---|
| JP | 2006-150538 A | 6/2006 |
| JP | 2006-313865 A | 11/2006 |

\* cited by examiner

TRANSPORT METHOD

This application is a national phase entry under 35 U.S.C. §371 of PCT Patent Application No. PCT/JP2011/002207, filed on Apr. 14, 2011, which claims priority under 35 U.S.C. §119 to Japanese Patent Application No. 2010-120035, filed May 26, 2010, both of which are incorporated by reference.

TECHNICAL FIELD

The present invention relates to a transport method of transporting, by using a transport robot, a thin plate-like object to be transported (referred to as a to-be-transported object) such as a semiconductor wafer, a glass substrate, and the like.

BACKGROUND ART

There is conventionally known a transport method comprising: transporting a to-be-transported object to a destination to which the to-be-transported object shall be transported (referred to as a transport destination) in a horizontal posture by a transport robot having a hand comprising stationary (or fixed) clamp members which are capable of coming into contact with a periphery of a thin plate-shaped to-be-transported object, and a movable clamp member which is pressed into contact with the periphery of the to-be-transported object to thereby pinch the to-be-transported, object between the stationary clamp members and the movable clamp member; and thereafter lowering the hand in a state of having moved the movable clamp member backward to an unclamped position out of contact with the periphery of the to-be-transported object, thereby transferring the to-be-transported object onto a plurality of supporting pins disposed in the transport destination (see, for example, Patent Document 1). It is to be noted that the stationary clamp members and the movable member are formed of a material such as a resin, rubber, and the like which is lower in hardness than the to-be-transported object.

By the way when the transport robot has been put to uses to a certain degree, the position of the to-be-transported object that has been transferred onto the supporting pins at a transport destination will sometimes deviate out of the normal position of the to-be-transported object. The cause for the positional deviation was considered to be attributable to the control error of the transport robot. But due to diligent efforts by the inventors of this application, the cause has been found to be as follows. That is, since the stationary clamp members and the movable clamp member are formed of a material that is lower in hardness than that of the to-be-transported object, the clamp members, once they have been put to uses to a certain degree, give rise to dents due to wear. Then, after the to-be-transported object has been seated on the supporting pins as a result of lowering of the hand at the transport destination, that peripheral portion of the to-be-transported object which has got caught by (or engaged with) the dents of the stationary clamp members is pulled down by the subsequent lowering of the hand, and the peripheral portion on the opposite side will then, be lifted off from the supporting pins. Once the peripheral portion of the to-be-transported object has been driven out of the dents of the stationary clamp members, the to-be-transported object will be swung into movement on the supporting pins, thereby giving rise to the positional deviation.

As a solution, in order to prevent the positional deviation of the to-be-transported object, it is considered to replace the stationary clamp members before they give rise to dents. However, once the stationary clamp members are replaced, it is necessary to teach once again the transport position of the robot, or to confirm the position, resulting in time consumption. Therefore, frequent replacing of the stationary clamp members will result in lowering in the operating rate of the apparatus.

PRIOR ART DOCUMENT

Patent Document

Patent Document 1: JP-A 2006-150538 (Paragraph 0035)

SUMMARY OF THE INVENTION

Problems to be Solved by the Invention

In view of the above-mentioned points, this invention has a problem of providing a transport method in which, even if the stationary clamp members may have given rise to dents to a certain degree, the to-be-transported object can be transferred onto the supporting pins without problem at the transport destination.

Means for Solving the Problems

In order to solve the above problems, this invention, is a transport method comprising: transporting a thin plate-shaped to-be-transported object to a transport destination is a horizontal posture by a transport robot having a hand comprising: stationary clamp members which are capable of coming into contact with a periphery of the to-be-transported object, and a movable clamp member which is pressed into contact with the periphery of the to-be-transported object to thereby pinch the to-be-transported object between the stationary clamp members and the movable clamp member: and thereafter lowering the hand, in a state of having moved the movable clamp member backward to an unclamped position out of contact with the periphery of the to-be-transported object, thereby transferring the to-be-transported object onto a plurality of supporting pins disposed, in the transport destination, in the method; the improvement comprises moving the hand in an X-axis plus direction at the time of lowering the hand to transfer the to-be-transported object onto the supporting pins, where a direction of opposing the stationary clamp members to the movable clamp member is defined as an X-axis direction, and a direction from the movable clamp member toward the stationary clamp members is defined as the X-axis plus direction.

According to this invention, due to the movement of the hand in the X-axis plus direction at the time of lowering the hand, the stationary clamp members move in the direction away from the periphery of the to-be-transported object after the to-be-transported object has been sealed in position onto the supporting pins. As a result, even if the stationary clamp members have given rise to a certain degree of dents, the peripheral portion of the to-be-transported object will be quickly brought out of the dents. The swinging movement of the to-be-transported object on the supporting pins can thus be suppressed, and the positional deviation of the to-be-transported object due to swinging movement can be prevented. Therefore, frequent replacement of the stationary clamp members become needless, whereby the operating rate of the apparatus can be improved.

By the way, if the hand is subjected to vibrations in the X-axis direction, at the time of lowering the hand, while moving the hand in the X-axis plus direction, the peripheral portion of the to-be-transported object becomes easier to be brought out of the dents of the stationary clamp members, in this case, the vibrations shall preferably be given by the change in acceleration at an initial time of starting movement of the hand in the X-axis plus direction. According to this arrangement, it is advantageous in that the transport robot is not required to be intentionally operated in a finely moving manner in order to vibrate the hand.

By the way, some of the to-be-transported objects are warped downward or upward. And the height of the hand at the time of seating of the to-be-transported object onto the supporting pins varies with the warping of the to-be-transported object. Therefore, if the hand is moved in the X-axis pins direction at the time of lowering the hand, the position of the hand in the X-axis direction at the time when the to-be-transported object is seated onto the supporting pins may also vary with the warping of the to-be-transported, object. As a result, there is a possibility that the to-be-transported, object will be transferred onto the supporting pins in a position away from the allowable range.

In order to solve this kind of disadvantage, at the time of lowering the hand to transfer the to-be-transported object onto the supporting pins, the hand shall preferably be subjected to repeated reciprocating; movements, at the time of lowering the hand, in the X-axis plus direction (the direction from the movable clamp member toward stationary clamp members) and in the X-axis minus direction (the direction from the stationary clamp members toward, the movable clamp member). According to this arrangement, at a position in the X-axis direction within the range of stroke of the reciprocating movement, the to-be-transported object will be transferred onto the supporting pins. Further, by setting the stroke of the reciprocating movements to a range within an allowable range of deviation of the transfer position, the to-be-transported object can be prevented from, being transferred onto the supporting pins at a position away from the allowable range.

In addition, preferably, the above-mentioned reciprocating movements are given by vibrations to be generated when the hand, is moved to the transport destination and is stopped there. According to this arrangement, it is not necessary for the transport robot to perform operation of reciprocating the hand, whereby saving in energy can be attained.

EMBODIMENTS FOR CARRYING OUT THE INVENTION

Figure 1:
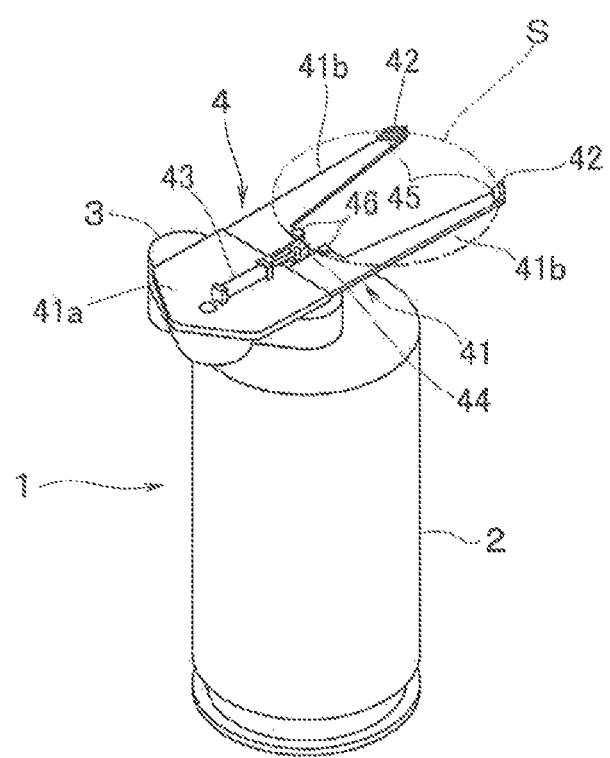
FIG. 1 is a perspective view of a transport robot to be used in carrying out the method of this invention.

With reference to FIG. 1, reference numeral 1 denotes a transport robot which transports thin plate-shaped objects to be transported (to-be-transported objects) S such as semiconductor wafers, glass substrates, and the like. This transport robot 1 is constituted by a SCARA robot made up of a robot main body 2 which is movable up and down and is swingable; a robot arm 3 winch is capable of bending and stretching and which is mounted on the robot main body 2; and a hand 4 which is coupled to a front end portion of the robot arm 3.

The hand 4 is made up of a hand main body 41 having a pair of finger portions 41b, 41b which are bifurcated at a base end portion 41a to be connected to the robot arm 3; a stationary clamp member 42 disposed on a front upper surface of each of the finger portions 41b; a movable clamp member 44 which is moved back and forth by a cylinder 43 mounted at the base end portion 41a; a receiving seat (or a mounting) 45 which is disposed on a front upper surface of each of the finger portions 41b in a manner integral with the stationary clamp members 42; and a receiving seat 46 which is disposed on an tipper surface of the base end portion of each of the finger portions 41b. The stationary clamp members 42 and the movable clamp member 44 are made of a material such as polyether ether ketone (PEEK) which is less harder than the to-be-transported object S.

The to-be-transported object S is supported by the hand main body 41 via receiving seats 45, 46. Then, by advancing the movable clamp member 44 toward the stationary clamp members 42 by means of the cylinder 43, the movable clamp member 44 is brought into pressing (urging) contact with the periphery of the to-be-transported object S so that the to-be-transported object S is pinched (held under pressing force) between the stationary clamp members 42 and the movable clamp member 44. Thereafter, the to-be-transported object S is transported to a transport destination in a horizontal posture by the operations of the robot man body 2 and the robot arm 3 of the transport robot 1.

Figure 2:
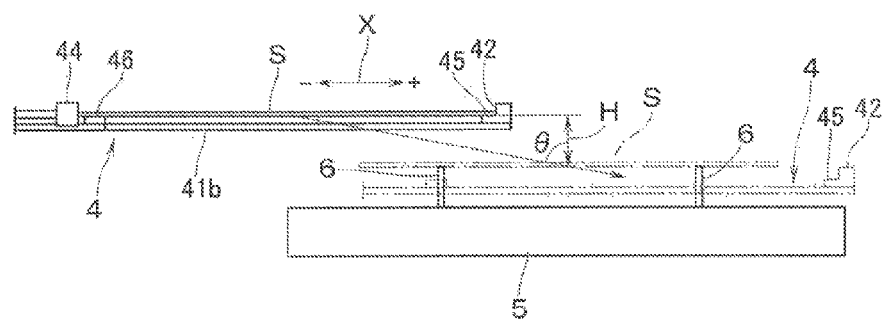
FIG. 2 is an explanatory view to show the movements of a hand, according to a first embodiment of the method of this invention when a to-be-transported object is transferred onto supporting pins.

With reference to FIG. 2, there is disposed a stage 5 at the transport destination. The stage 5 is provided with a plurality of (e.g., 3) supporting pins 6. And after having moved the hand 4 to a position above the stage 5, the hand 4 is lowered in a state in which the movable clamp member 44 is receded to an unclamped position out of engagement with the periphery of the to-be-transported object S. The to-be-transported object S is thus transferred onto the supporting pins 8 positioned in an elevated position. Thereafter the hand 4 is pulled, out of the position under the to-be-transported object S and, subsequently by lowering the supporting pins 6, the to-be-transported object S is placed on an upper surface of the stage 5.

Figure 3:
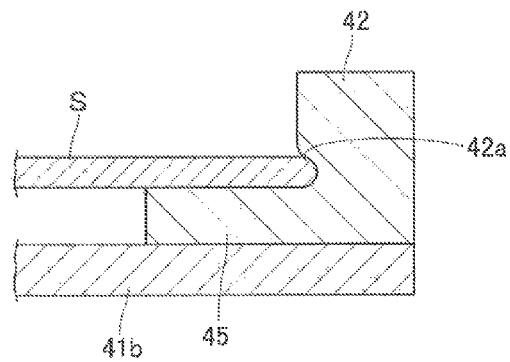
FIG. 3 is a sectional view showing dents that may be generated in stationary clamp members.

Here, since the stationary clamp members 42 are formed of a material which is lower in hardness than the to-be-transported, object S, after a certain degree of uses, the stationary clamp members 42 will give rise to dents 42a due to wear, as shown in FIG. 3, at a portion of contact with the to-be-transported object S. In this case, if the hand 4 is lowered right downward, the to-be-transported object S will be seated onto the supporting pins 6 and, thereafter, the peripheral portion of the to-be-transported object S that has got stuck with (or caught by) the dents 42a of the stationary clamp members 42 is pulled down, by the succeeding lowering of the hand 4, whereby the peripheral portion on the opposite side of the to-be-transported object S will be lifted off from the supporting pins 6. Then, once the peripheral, portion of the to-be-transported object S has cleared the dents 42a of the stationary clamp members 42, the to-be-transported object S will be subjected to swinging movement on the supporting pins 6. As a result, there is a possibility that the to-be-transported object S will deviate from the normal transfer position relative to the supporting pins 6. Especially, if the hand 4 is pulled out right after having transferred the to-be-transported object S onto the supporting pins 6 to improve the working efficiency the upper end of the stationary clamp members 42 will get entangled with (or caught by) the to-be-transported object S that is in the state of swinging movement on the supporting pins 6, thereby resulting in a large positional deviation of the to-be-transported object S.

As a solution, in this embodiment, suppose: that the direction in which the stationary clamp members 42 oppose the movable clamp member 44 is defined as an X-axis direction; that the direction from the movable clamp member 44 toward the stationary clamp members 42 is defined as an X-axis plus direction; and that the direction from the stationary clamp members 42 toward the movable clamp member 44 is defined as an X-axis minus direction. Then, at the time of lowering the hand to transfer the to-be-transported object S onto the supporting pins 6, it is arranged, as shown by an arrow in FIG. 2, that the hand 4 is moved, while kept lowering, in the X-axis plus direction.

According to this arrangement, once the to-be-transported, object S has sat onto the supporting pins 8, due to the movement of the hand 4 in the X-axis plus direction, the stationary clamp members 42 will move in the direction away from the periphery of the to-be-transported object S. As a result, the peripheral portion of the to-be-transported object S can quickly get out of the dents 42a in the stationary clamp members 42 and swinging movement of the to-be-transported object S on the supporting pins 8 will be suppressed. The to-be-transported object S can thus be prevented from getting positionally deviated due to the swinging movement thereof.

Now, as compared with the initial state in which there is no dent 42a, once the dents 42a have occurred, the area of contact with the to-be-transported object S will increase and the speed of size enlargement of the dents 42a will slow down. Then, according to this embodiment, even if the stationary clamp members 42 have given rise to a certain degree of dents 42a, the to-be-transported object S can be prevented from positionally deviating. Therefore, the stationary clamp members 42 can be used for a long period, of time. As a result, the frequency of replacing the stationary clamp members 42 can be remarkably reduced, thereby dramatically improving the rate of working of the apparatus.

By the way, at the time of lowering the hand, the hand 4 may be vibrated in the X-axis direction while the hand 4 is kept moving in the X-axis direction. According to this arrangement, the peripheral portion of the to-be-transported object S comes to easily get out of the dents 42a of the stationary clamp members 42, whereby the positional deviation of the to-be-transported object S can more surely be prevented.

Here, the vibrations of the hand 4 in the X-axis direction can be given by intentionally bending and stretching the robot arm 3 in a precise manner. Further, depending on the weight or rigidity of the hand 4 or the robot arm 3, the robot arm 3 will be subjected to vibrations due to change in acceleration. Therefore, by causing the change in acceleration in the X-axis plus direction of the hand 4 at an initial time of starting the movement to be more than a predetermined value, vibrations in the X-axis direction of the hand 4 can be given. In concrete, by suddenly accelerating the hand 4 in the X-axis plus direction and then switching to deceleration or to normal-speed movement, vibrations in the X-axis direction can be generated. In this manner, if the vibrations in the X-axis direction can be given by the change in acceleration at the initial time of starting the movement of the hand 4 in the X-axis plus direction, it is advantageous in that the robot arm 3 need not be intentionally and finely bent and stretched.

Alternatively, before lowering the hand, the hand 4 may be caused to vibrate in the X-axis direction by the operation of the robot arm 3 and, before the vibrations cease to exist, the hand 4 may be moved, while lowering it, in the X-axis pins direction.

By the way, suppose that the difference in height between the lower surface of the to-be-transported object S before lowering the hand and the upper end of the supporting pins 6 is defined as H, and that the angle of inclination of movement of the hand relative to the vertical direction at the time of lowering the hand is defined as θ. The hand 4 is moved in the X-axis plus direction while lowering from the position that is offset in the X-axis minus direction by an amount of H tan θ from the normal transfer position of the to-be-transported object S relative to the supporting pins 6. It is thus so arranged that, at the time when the to-be-transported object S has seated onto the supporting pins 6, the to-be-transported object S will reach the normal transfer position. However, some of the to-be-transported objects S may have been warped downward or upward. The height of the hand 4 at the time point when the to-be-transported object S is seated onto the supporting pins 6 will be relatively high when the to-be-transported object S is warped downward, and will be relatively low when the to-be-transported object S is warped upward. Therefore, when the hand 4 is moved in the X-axis plus direction at the time of lowering the hand, the position of the hand 4 in the X-axis direction at the time point when the to-be-transported, object S is seated on the supporting pins 6 will also vary with the warping of the to-be-transported object S. There is thus a possibility that the to-be-transported object S is transferred onto the supporting pins 6 at a position away from the allowable range.

Figure 4:
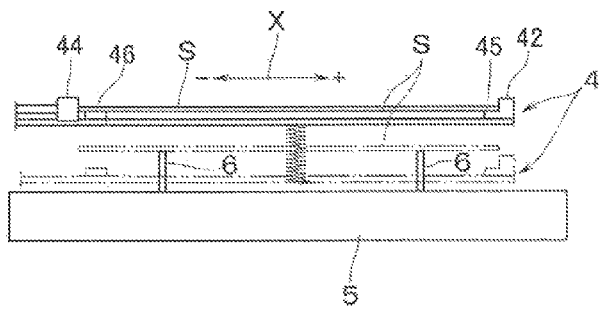
FIG. 4 is an explanatory view to show the movements of the hand according to a second embodiment of the method of this invention when the to-be-transported object is transferred onto the supporting pins.

Then in the second embodiment as shown in FIG. 4, at the time of lowering the hand in order to transfer the to-be-transported object S onto the supporting pins 6, the hand 4 is subjected to repeated reciprocating movements in an X-axis plus direction and in an X-axis minus direction at the time of lowering the hand 4 to transfer the to-be-transported object S onto the supporting pins 6.

In this case, at the time of forward movement of the hand 4 in the X-axis plus direction after the to-be-transported object S has been seated onto the supporting pins 6, the peripheral portion of the to-be-transported object S will be pulled out of the dents 42a in the stationary clamp members 42, whereby the positional deviation of the to-be-transported object S is prevented. Then at a position in the X-axis direction within the range of reciprocating movements of the hand 4, the to-be-transported object S will be transferred onto the supporting pins 6. Therefore, by setting the stroke of the reciprocating movements within an allowable range of deviation of the transfer position, even in case the to-be-transported object S is warped, the to-be-transported object S can be prevented from being transferred onto the supporting pins 6 at a position away from the allowable range.

Here the reciprocating movement of the hand 4 in the X-axis plus direction and in the X-axis minus direction can be given by bending and stretching operations of the robot arm 3 at the time of lowering the hand. Further depending on the weight or rigidity of the hand 4 or the robot arm 3, when the hand 4 is moved to the transport destination and is stopped there, the robot arm 3 will vibrate, and the hand 4 will be subjected to vibrations in the X-axis direction. Therefore, before the vibrations cease to exist, the hand 4 is lowered and, due to the vibrations, the reciprocating movements in the X-axis plus direction and in the X-axis minus direction of the hand 4 can be given.

As described hereinabove, if the reciprocating movements are given by the vibrations to be generated at the time of stopping the movement of the hand 4, the robot arm 3 need not be bent and stretched in order to reciprocate the hand 4, whereby energy saving can be attained.

Alternatively an arrangement may also be made in which, before lowering of the hand, the hand 4 is subjected to vibrations in the X-axis direction by the operation, of the robot arm 3 and, before the vibrations cease to exist, the hand 4 is lowered.

Descriptions have so far been, made of embodiments of this invention with reference to the drawings. This invention is however not limited to the above. For example, the hand 4 in the above-mentioned embodiments has stationary clamp members 42 at its front end side and a movable clamp member 44 on the base end side. An arrangement may also be made that the movable clamp member is disposed on the front end side and the stationary clamp members are disposed on the base end side. In addition, the supporting pins 6 may be of fixed type that is not moved up and down.

DESCRIPTION OF REFERENCE MARKS

S tome-transported object
1 transport robot
4 hand
42 stationary clamp member
44 movable clamp member
6 supporting pins

What is claimed is:

1. A transport method comprising:
   transporting a thin plate-shaped to-be-transported object to a transport destination in a horizontal posture by a transport robot having a hand comprising stationary clamp members which are capable of coming into contact with a periphery of the to-be-transported object, and a movable clamp member which is pressed into contact with the periphery of the to-be-transported object to thereby pinch the to-be-transported object between the stationary clamp members and the movable clamp member;
   thereafter lowering the hand in a state of having moved the movable clamp member backward to an unclamped position out of contact with the periphery of the to-be-transported object, thereby transferring the to-be-transported object onto a plurality of supporting pins disposed in the transport destination, wherein the improvement comprises moving the hand in an X-axis plus direction at the time of lowering the hand to transfer the to-be-transported object onto the supporting pins, where a direction of opposing the stationary clamp members to the movable clamp member is defined as an X-axis direction, and a direction from the movable clamp member toward the stationary clamp members is defined as the X-axis plus direction; and
   subjecting the hand to vibrations in the X-axis direction, at the time of lowering the hand, while moving the hand in the X-axis plus direction.

2. The transport method according to claim 1, wherein the vibrations are given by the change in acceleration at an initial time of starting movement of the hand in the X-axis plus direction.

3. A transport method comprising:
   transporting a thin plate-shaped to-be-transported object to a transport destination in a horizontal posture by a transport robot having a hand comprising stationary clamp members which are capable of coming into contact with a periphery of the to-be-transported object, and a movable clamp member which is pressed into contact with a periphery of the to-be-transported object to thereby pinch the to-be-transported object between the stationary clamp members and the movable clamp member; and
   thereafter lowering the hand in a state of having moved the movable clamp member backward to an unclamped position out of contact with the periphery of the to-be-transported object, thereby transferring the to-be-transported object onto a plurality of supporting pins disposed in the transport destination,
   wherein the improvement comprises subjecting the hand to repeated reciprocating movements in an X-axis plus direction and in an X-axis minus direction at the time of lowering the hand to transfer the to-be-transported object onto the supporting pins, where a direction of opposing the stationary clamp members to the movable clamp member is defined as an X-axis direction, a direction from the movable clamp member toward the stationary clamp members is defined as the X-axis plus direction, and a direction from the stationary clamp members toward the movable clamp member is defined as the X-axis minus direction.

4. The transport method according to claim 3, wherein the reciprocating movements are given by vibrations to be generated when the hand is moved to the transport destination and is stopped there.

* * * * *